United States Patent [19]
Jokura

[11] Patent Number: 5,856,761
[45] Date of Patent: Jan. 5, 1999

[54] PLL FREQUENCY SYNTHESIZER USING PLURAL PHASE COMPARATORS AND FREQUENCY DIVIDERS

[75] Inventor: Jun Jokura, Tokyo, Japan

[73] Assignee: NEC Corporation, Tokyo, Japan

[21] Appl. No.: 864,974

[22] Filed: May 28, 1997

[30] Foreign Application Priority Data

May 29, 1996 [JP] Japan .................................. 8-134515

[51] Int. Cl.$^6$ .............................. H03L 7/087; H03L 7/18
[52] U.S. Cl. .............................. 331/11; 331/14; 331/25; 331/1 A
[58] Field of Search .............................. 331/1 A, 11, 14, 331/25

[56] References Cited

U.S. PATENT DOCUMENTS

| | | | |
|---|---|---|---|
| 3,571,743 | 3/1971 | Menkes | 331/11 |
| 5,254,959 | 10/1993 | Wünsch | 331/12 |
| 5,521,948 | 5/1996 | Takeuchi | 331/11 |
| 5,550,515 | 8/1996 | Liang et al. | 331/11 |

FOREIGN PATENT DOCUMENTS

| | | |
|---|---|---|
| 0526227 | 2/1993 | European Pat. Off. . |
| 0566274 | 10/1993 | European Pat. Off. . |

OTHER PUBLICATIONS

Adachi et al., "High–Speed Frequency Switching Synthesizer Using Fractional N Phase Locked Loop", *Transactions of the IEICE C–I*, vol. J76–C–I, No. 11 Nov. 1993, pp. 445–452.

*Primary Examiner*—Siegfried H. Grimm
*Attorney, Agent, or Firm*—Sughrue, Mion, Zinn, Macpeak & Seas, PLLC

[57] ABSTRACT

A PLL frequency synthesizer for realizing high-speed operation in a frequency synthesizer having a small channel interval $\Delta f$. There are provided n-number of phase comparators, feedback frequency dividers, and reference signal frequency dividers, and a timing generating section for outputting a signal causing each of the frequency dividers to become enabled every cycle of $n \times \Delta f$. An OR gate for superposing each phase comparison signal. Each phase comparison signal is sent to a charge pump after a cycle of $n \times \Delta f$, and the reference frequency is capable of being raised to n times the channel interval $\Delta f$. Further, a control section monitors lock detection of each phase comparator, thus implementing voltage control of each phase comparison system. When the synthesizer arrives at convergence-synchronization, the power sources to all systems are turned OFF except for the phase comparison system initiating the lock signal.

10 Claims, 3 Drawing Sheets

PLL FREQUENCY SYNTHESIZER USING PLURAL PHASE COMPARATORS AND FREQUENCY DIVIDERS

BACKGROUND OF THE INVENTION

The present invention relates to a phase-locked loop (PLL) frequency synthesizer, and in particular to a PLL frequency synthesizer which is suitable for use in a communication system in which the channel interval is small.

DESCRIPTION OF THE PRIOR ART

In general, in order to handle a higher capacity in a communication system, a small channel interval is established. However, in cases where the channel interval is small, the ratio of frequency division of the PLL loop constituting a PLL frequency synthesizer becomes large. Since the comparing-reference frequency which is used to compare one channel with another becomes low, the implementation of high-speed operation is difficult, with the result that it takes a lot of time for switching between frequencies (i.e., a channel switch).

An article from the Institute of Electronic Information Communication November 1993, C-1, Vol. J76-C-I, No. 11, pages 445–452, written by H. ADACHI ET AL. and entitled "High-Speed Frequency Switching Synthesizer Using Fractional N Phase Locked Loop" discloses a technique for high-speed frequency switching of a PLL frequency synthesizer for use in communication equipment of a communication system in which the channel interval is small.

FIG. 1 is a block diagram of the frequency synthesizer disclosed in the above article. Referring to FIG. 1, one input of a phase comparator 2 is provided for receiving the frequency fr of a reference signal from oscillator 1. The phase comparator 2 also receives, as another input, a signal being formed from an output of a VCO (Voltage Controlled Oscillator) 5 which is subjected to frequency division by a frequency divider 6.

A pair of outputs U, D of the phase comparator 2 are delivered as the control voltage of VCO 5 via a charge pump 3 and a loop filter 4. Here, U and D each represent absolute value and a sign of the phase difference, and also represent the lead (U) or the delay (D) of the reference signal.

The frequency divider 6 applies a ratio of frequency division given as the fractional value 1/(M+k/L) to the output VCO 5. The ratio of frequency division is controlled by an accumulator 7 consisting of an adder 71, a latch 72, and a control section 73.

The control section causes the output of the adder 71 to implement a latch operation by the latch 72 in synchronizing with the reference frequency fr of the reference signal thus increasing an addition output by the value k. When the adder 71 comes into over-flow, the frequency division ratio becomes M+1. On the other hand, when the over-flow does not occur, the frequency division ratio maintains M.

It takes 1 clock for 1 cycle (1/f) of the reference signal. As shown in FIG. 2, during L clocks (time T), the frequency division ratio M switches to M+1 only once. At this time, an average value of the ratio of frequency division in the time T comes into M+1/L. Since 1/L can be considered as K/L which is expanded, let k stand for 0, 1, 2, . . . , thus the ratio of frequency division in terms of 1/L step is capable of being decided.

Here, KPD stands for sensitivity of the phase comparator 2, Kv for sensitivity of the VCO, $f_{out}$ for the output frequency, and $f_r$ for reference frequency. A loop gain Ko becomes: $Ko = Kv \cdot KPD/N = Kv \cdot KPD/(f_{out}/f_r)$. Consequently, the value of loop gain Ko becomes large when N is small, namely, when $f_r$ is large. It thus becomes possible to shorten the convergence time.

In the fractional N phase locked loop shown in FIG. 1, the ratio of frequency division changes with respect to the time T as the reference cycle. Thereby, the frequency component of 1/T and its whole number times of occurence appear as the output of the phase comparator. Thus, the output signal of the VCO is modulated.

As a result, the problem of a high number of spurious signals generated in the neighborhood of the center frequency of the output signal occurs.

SUMMARY OF THE INVENTION

In view of the foregoing, it is an object of the present invention to provide a PLL frequency synthesizer which is capable of high-speed channel switching without generating a high number of spurious signals in a large capacity communication system with small channel intervals using high reference frequency.

According to one aspect of the present invention, in order to achieve the above-mentioned object, there is provided a PLL (Phase Locked Loop) frequency synthesizer which comprises voltage control oscillation means, n-units (n is an integer number more than 2) of phase comparison means, n-units of oscillation signal frequency-division means corresponding to the n-units of phase comparison means causing the frequency of the oscillation signal of the voltage control oscillation means to be subjected to frequency division, thus making it one input of corresponding phase comparison means, n-units of reference signal frequency-division means corresponding to the n-units of phase comparison means causing the frequency of the reference signal to be subjected to frequency division, thus making it another input of corresponding phase comparison means, control voltage generating means for generating control voltage of the voltage control oscillation means in answer to the outputs of the n-units of phase comparison means, and control means for performing activation-control in turning on n-groups of both of the oscillation signal frequency-division means and the reference signal frequency-division means during each respective cycle interval over n intervals of the reference signal in answer to a channel changing instruction.

According to another aspect of the invention, there is provided a PLL frequency synthesizer wherein each of the phase comparison means have a function for generating a phase synchronization detecting signal at the time of a phase synchronization state, the control means performs non-activation control on all of the phase comparison means except for the phase comparison means generating the phase synchronization detecting signal, and also on all of the other corresponding oscillation signal frequency-division means and reference signal frequency-division means.

As stated above, there is provided a plurality of groups (n groups) of frequency dividers for causing the reference frequency to be subjected to n frequency divisions, a plurality of groups (n groups) of frequency dividers for causing the output of a VCO to be subjected to frequency division, and a plurality of groups of phase comparators for implementing phase comparison of the frequency division output thereof. This causes these n-groups of devices to delay in turn by one cycle of reference frequency. The phase comparison outputs of these n-groups of devices are superposed, thus becoming the VCO control voltage through a charge pump and a LPF (loop filter).

For this reason, even if each group's phase frequency is a low frequency of 1/n reference frequency, since the phase difference signal actually sent to the charge pump is the signal in which all n-groups signals are superposed, the apparent comparison frequency in terms of the PLL system becomes the former frequency of 1/n reference frequency. Consequently, it is possible to achieve a high-speed in a system with small channel interval while remaining in high reference frequency.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of the invention will now be described in detail referring to the accompanying drawings.

Figure 1:
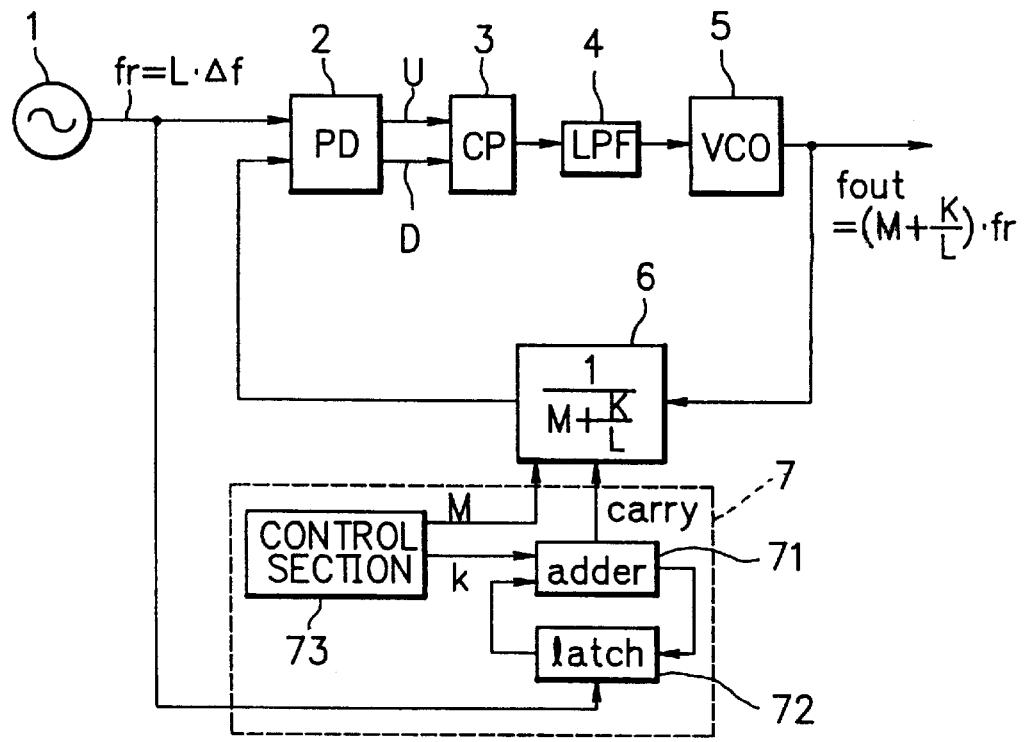
FIG. 1 is a view showing an example of the conventional PLL frequency synthesizer.
Figure 2:
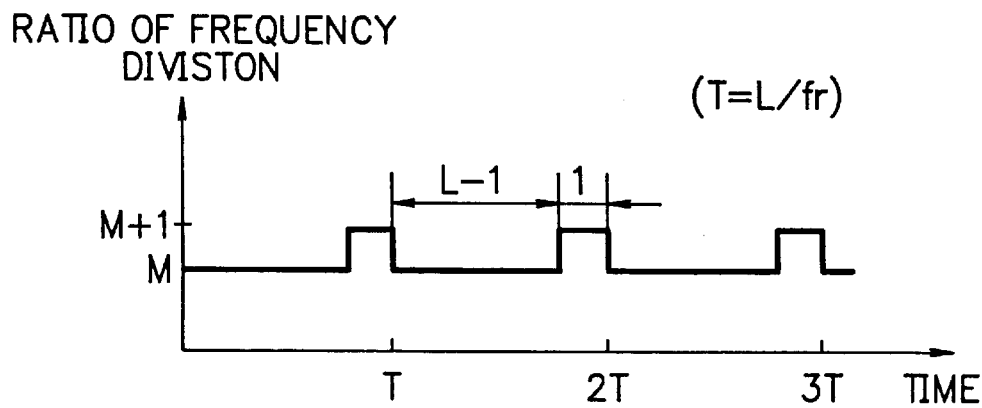
FIG. 2 is a view showing block operation of FIG. 1.
Figure 3:
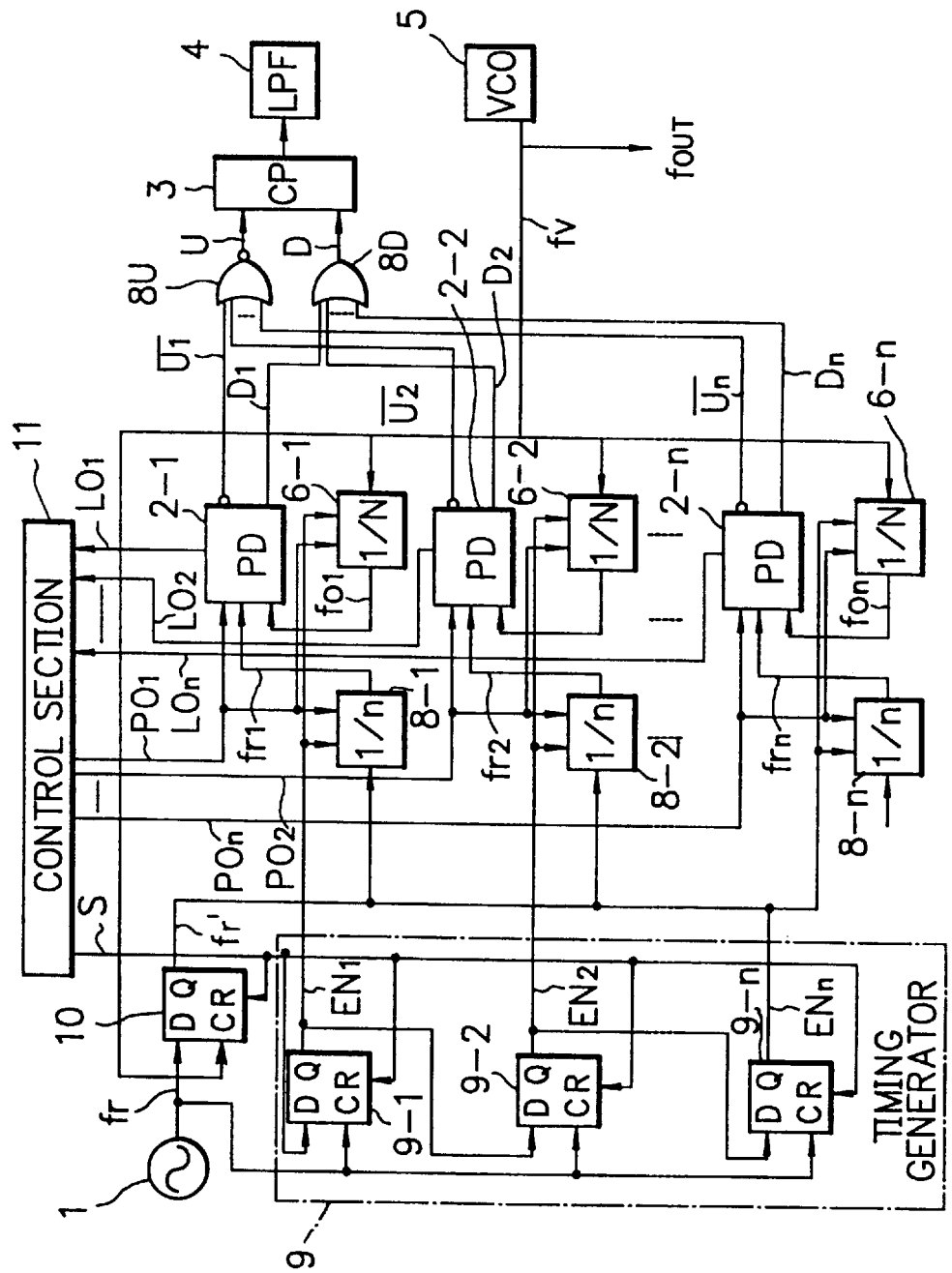
FIG. 3 is a block diagram showing one embodiment according to the present invention.

FIG. 3 is a block diagram of one embodiment of the invention. The same elements as those of FIG. 1 are indicated by the same reference numbers and signs. In FIG. 3, n-units of frequency dividers 8-1 to 8-n implement 1/n frequency division on a reference frequency fr oscillation signal from an oscillator 1. Furthermore, n-units of frequency dividers 6-1 to 6-n implement 1/N-frequency is division on an oscillation frequency signal fv from VCO 5.

In addition, n-units of phase comparators 2-1 to 2-n are provided. The comparator 2-1 implements phase comparison of the frequency division outputs of the frequency divider 8-1 and the frequency divider 6-1. The comparator 2-2 implements phase comparison of the frequency division outputs of the frequency divider 8-2 and the frequency divider 6-2. In this same manner, the comparator 2-n implements phase comparison of both frequency division outputs of the frequency divider 8-n and the frequency divider 6-n.

Each of the phase comparators, similar to those in the conventional example of FIG. 1, generates a pair of comparison outputs U and D, and particularly in this embodiment, an inverted value as output U indicating a lead phase difference is derived.

All of the inverted values of the comparison outputs U are subjected to inclusive OR superposition at NOR-gate 8U. All of the comparison outputs D are subjected to inclusive OR superposition at OR-gate 8D. Each of these superposition outputs are input to charge pump 3. The output of the charge pump 3 is used as a control voltage of VCO 5 through loop filter 4.

Oscillation output fr of the oscillator 1 is not directly applied to the n-units of frequency dividers 8-1 to 8-n. Instead, the output fr is input to a D-type flip-flop 10 for re-timing. The output fr is subjected to retiming by the oscillation output fv of the VCO 5 into fr' which, in turn, is input to each of the n numbers of the frequency dividers 8-1 to 8-n.

A timing generator 9 responds to a set signal S from the control section 11. The timing generator 9 generates n number of timing signals EN1 to ENn. The number of timing signals EN1 to ENn each lag in turn by one-period (1/fr) of the oscillation output frequency fr of the oscillator 1 before becoming active. The timing generator 9 is composed of n-stages of D-type flip-flops 9-1 to 9-n connected continuously with each other. Inputs of the n-stages of D-type flip-flops are the set signal S to a reset-input (R), and the reference frequency fr to clock-input (C).

The set signal S is input to a data-input of the first-stage flip-flop 9-1. The output Q thereof is, in turn, input into a data-input of the next-stage flip-flop 9-2. The output Q of the next-stage becomes, in turn, a data-input for stage 9-3. Each of the outputs Q of these n-stages of flip-flops 9-1 to 9-n become the timing signals EN1 to ENn.

The timing signal EN1 implements activation of both the frequency divider 6-1 and the frequency divider 8-1. The timing signal EN2 implements activation of both the frequency divider 6-2 and the frequency divider 8-2. And then in the same manner as above procedure, the timing signal ENn implements activation of both the frequency divider 6-n and the frequency divider 8-n.

The control section 11 responds to a channel change instruction, thus generating the set signal S. The control section 11 implements reset of re-timing flip-flop 10, and reset of each flip-flop 9-1 to 9-n of the timing generator 9.

The control section 11 receives an input for phase lock detection signals LO1 to LOn from each of the phase comparators 2-1 to 2-n. M is a whole number from 1 to n, and when phase lock is detected in m-th phase comparator 2-m, a power supply OFF signal PO is generated. The power supply OFF signal PO switches all of the phase comparators and the frequency dividers into a non-activated state except for the m-th phase comparator 2-m and the m-th frequency dividers 6-m and 8-m. Each of the phase comparators 2-1 to 2-n has a function of generating lock detection signals LO1 to LOn when both input signals from the frequency dividers come into phase lock state.

In this constitution, there are provided n-units of phase comparators, n-units of VCO oscillation signal frequency dividers (called a feedback frequency divider) inputting to the phase comparators, and n-units of reference oscillation signal frequency dividers. Namely, is there are provided n-sets (n-systems) of these circuits. The frequency dividers 6-1 to 6-n of each set divide VCO output frequency fv into 1/N. The frequency dividers 8-1 to 8-n of each set divide reference oscillation frequency fr' into 1/n. Both of them have a function that causes each frequency to drop to the channel space $\Delta f$ (=fr'/n, fv/N).

Figure 4:
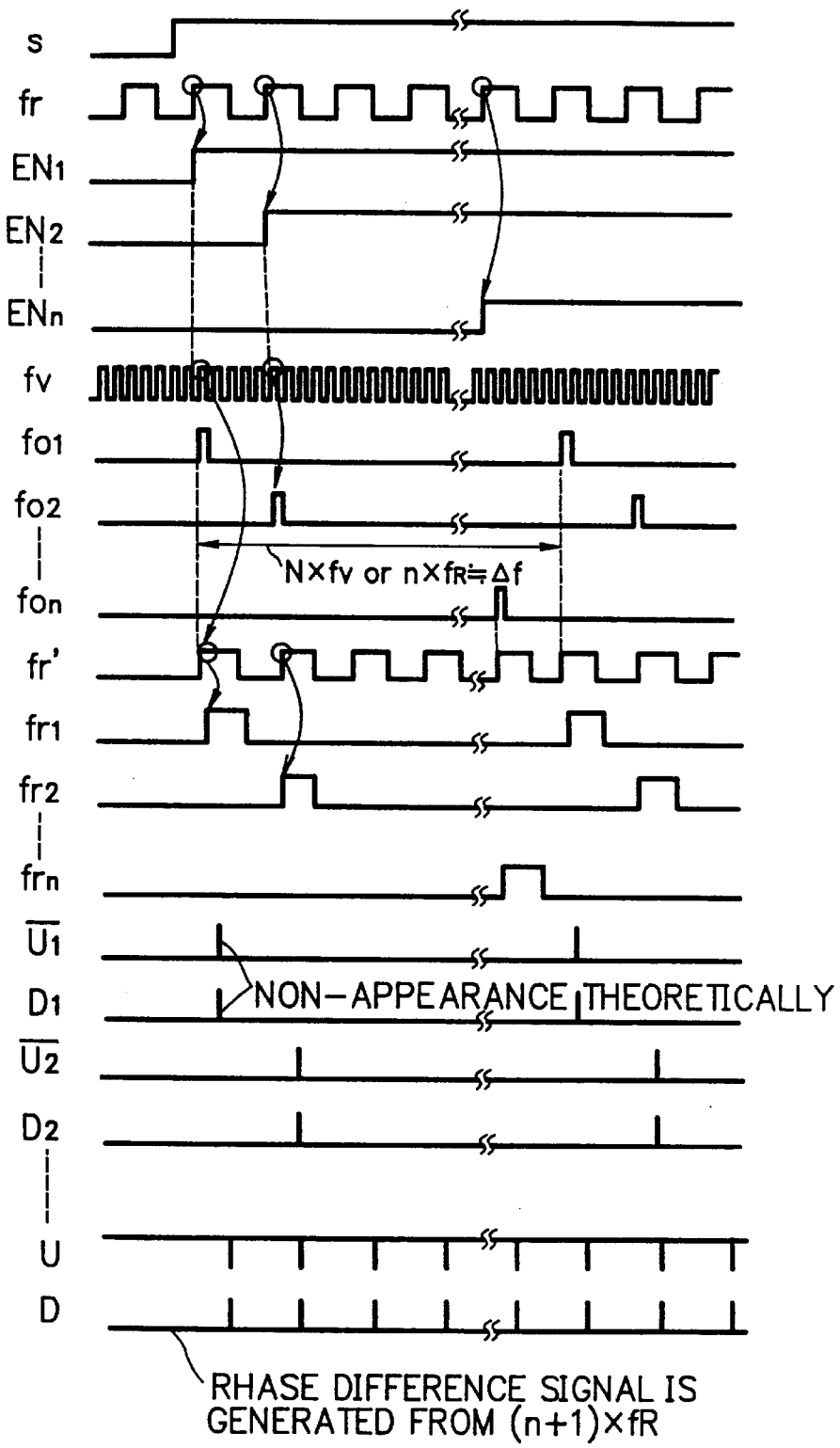
FIG. 4 is a timing chart showing operation of the embodiment of the invention.

As shown in operation timing chart of FIG. 4, each of the frequency dividers respond to the set signal S. Each of the frequency dividers is activated by one of the timing signals EN1 to ENn which are generated with each rising of the reference signal fr, respectively.

Following is an example of PLL synchronization in which channel space is 200 KHz, and the output frequency is 999.8 MHz. This case results in N=4999. And when n=5 is selected, this case results in fr=n×200 KHz=1 MHz. The timing signals EN1 to ENn rise (become enabled) every 1M cycles.

When fv is in the range 999.8 MHz≦fv<1 GHz, the rising interval of pulses of f01 to f05 correspond to 1000-cycles of fv. However, the second pulse of f01 occurring after the first pulse of f05 does not correspond to the 1000th cycle but the 999th cycle.

Furthermore, when fv is 999.75 MHz≦fv<999.8 MHz, space between f04 and f05 corresponds to 999-cycles of fv. In the same manner as above, when fv is 999.67 MHz≦fv<999.75 MHz, only space between f03 and f04 corresponds to 999-cycle of fv.

As stated above, when fv is in the range 999 MHz≦fv<1001 MHz, 10 space of f01 to f05 is related to 1000±1-cycle of fv. While fr1 to fr5 are similar to those of above cases, when fv is 999.75≦fv<999.8 MHz, the rising interval of pulses of fr1 to fr5 becomes 999-cycles only in the case of fr4 to fr5.

In the phase comparison between f0i and fri (i=1 to 5), each of the leading edges corresponding to the first pulse of the pulses f01, fr1 responding to the rising timing of the set signal S is of relationship of always having the same phase due to operation of re-timing flip-flop FF 10, thereby the phase comparison output is generated after each of the second pulses of f01, fr1. The phase comparison output generated by each phase comparator is subjected to the inclusive OR superposition at the OR-gates 8U and 8D which, in turn, supply driving signals to the charge pump 3.

Each phase comparison output is generated based upon the phase relationship of each of fri, f0i after n×fri, n×f0i from the initial input of fri, f0i. Namely, each phase comparison signal is generated synchronously at the time of pulse generation of each fr'. The generating cycle thereof becomes 1/fr on average.

Based on the relationship of fr=n×Δf, the reference frequency fr is established to n times of Δf of the channel space.

In the control section 11, the set signal becomes enabled when channel switch is directed. At the time when it is ascertained that a phase difference has entered into a prescribed tolerance (phase locked condition) in the phase comparison of either system of n-number of the phase comparators 2-1 to 2-n (i.e., either of LO1 to LOn comes into enable), it causes all systems of the phase comparators except for this phase comparator to be non-activated.

For this reason, the signal PO causes a power source of the systems, except for the system in which the phase lock is detected, to switch off by direction of the control section 11. As a result, after entrance into convergence synchronism, only the phase comparator in the phase locked system and a single system of frequency dividers operate continuously. The synchronism is maintained by the PLL loop of the reference frequency due to the phase comparison output with 1/Δf cycle.

When the channel change is implemented again, all of the phase comparison systems are switched on (activation) and the set signal S becomes enabled. Again, each frequency divider rises with the delay of every 1/fr cycle. This permits the reference frequency of the phase comparison to rise to n×Δf. Thus, high speed switching becomes possible and the frequency division ratio N becomes variable by virtue of the channel change.

As described above, according to the present invention, there are provided n-systems of the phase comparison systems which operate on the reference frequency Δf of the channel interval. This causes the n-systems of phase comparison systems to shift by (1/n)Δf, thus generating the phase comparison output of each system. Each of these phase comparison outputs which are superposed is employed except for the fractional frequency division method. Therefore, the reference frequency of the PLL-system is capable of being high as established by n×Δf. Accordingly, high-speed switching becomes possible.

Furthermore, after converging, all of the power sources excluding one-system of phase comparison system are switched OFF, so that operation thereof is implemented under the reference frequency Δf, thereby having the effect of improving the noise characteristic in synchronous state.

While preferred embodiments of the invention have been described using specific terms, such description is for illustrative purposes only, and it is to be understood that changes and variations may be made without departing from the spirit or scope of the following claims.

What is claimed is:

1. A PLL (Phase Locked Loop) frequency synthesizer comprising:

voltage control oscillation means;

n-units of phase comparison means, wherein n is a whole number greater than 2, each of said n-units of phase comparison means having respective first and second outputs;

n-units of oscillation signal frequency-division means corresponding to said n-units of phase comparison means causing the frequency of an oscillation signal from said voltage control oscillation means to be subjected to a first frequency division, wherein an output of each said oscillation signal frequency-division means is a first input of each corresponding phase comparison means;

n-units of reference signal frequency-division means corresponding to said n-units of phase comparison means causing the frequency of a reference signal to be subjected to a second frequency division, wherein an output of each reference signal frequency-division means is a second input of each corresponding phase comparison means;

control voltage generating means for generating a control voltage of said voltage control oscillation means in response to respective superpositions of said first and second outputs of said n-units of phase comparison means; and control means for performing activation-control to sequentially turn on n-units of both of said oscillation signal frequency-division means and said reference signal frequency-division means during each respective cycle interval over n intervals of said reference signal in response to a channel changing instruction.

2. A PLL frequency synthesizer according to claim 1, wherein each of said n-units of phase comparison means have a function for generating a phase synchronization detecting signal at the time of a phase synchronization state, wherein said control means performs non-activation-control on said n-units of phase comparison means except for a phase comparison means generating said phase synchronization detecting signal, on all of another corresponding oscillation signal frequency-division means and reference signal frequency-division means.

3. A PLL frequency synthesizer according to claim 1, further comprising re-timing means for synchronizing the leading edge timing of said reference signal with that of said oscillation signal of said voltage control oscillation means.

4. A PLL frequency synthesizer according to claim 2, further comprising re-timing means for synchronizing the leading edge timing of said reference signal with that of said oscillation signal of said voltage control oscillation means.

5. A PLL frequency synthesizer according to claim 3, wherein said re-timing means is a D-type flip-flop having said reference signal connected as a data input, and said oscillation signal connected as a clock input.

6. PLL frequency synthesizer according to claim 4, wherein said re-timing means is a D-type flip-flop having said reference signal connected as a data input, and said oscillation signal connected as a clock input.

7. A PLL frequency synthesizer according to claim 1, wherein said control voltage generating means comprises means for deriving an OR output from n number of the phase comparison outputs, a charge pump means receiving said OR output as an input, and a loop filter means receiving the output of said charge pump means as an input.

8. A PLL frequency synthesizer according to claim 2, wherein said control voltage generating means comprises means for deriving an OR output from n number of the phase comparison outputs, a charge pump means receiving said OR output as an input, and loop filter means receiving the output of said charge pump means as an input.

9. A PLL frequency synthesizer according to claim 3, wherein said control voltage generating means comprises means for deriving an OR output from n number of the phase comparison outputs, a charge pump means receiving said OR output as an input, and loop filter means receiving the output of said charge pump means as an input.

10. A PLL frequency synthesizer according to claim 6, wherein said control voltage generating means comprises means for deriving an OR output from n number of the phase comparison outputs, a charge pump means receiving said OR output as an input, and loop filter means receiving the output of said charge pump means as an input.

* * * * *